(12) United States Patent
Soltani et al.

(10) Patent No.: US 11,988,871 B2
(45) Date of Patent: May 21, 2024

(54) PHOTONIC INTEGRATED CIRCUIT (PIC) RADIO FREQUENCY OSCILLATOR

(71) Applicant: Raytheon BBN Technologies, Corp., Cambridge, MA (US)

(72) Inventors: Moe D. Soltani, Belmont, MA (US); Ken Dinndorf, Belford, NH (US); Jack W. Holloway, Arlington, VA (US); Gerhard Sollner, Lincoln, MA (US)

(73) Assignee: Raytheon BBN Technologies, Corp., Cambridge, MA (US)

( * ) Notice: Subject to any disclaimer, the term of this patent is extended or adjusted under 35 U.S.C. 154(b) by 213 days.

(21) Appl. No.: 17/845,900

(22) Filed: Jun. 21, 2022

(65) Prior Publication Data

US 2022/0404550 A1     Dec. 22, 2022

Related U.S. Application Data

(60) Provisional application No. 63/213,137, filed on Jun. 21, 2021.

(51) Int. Cl.
    *G02B 6/125*           (2006.01)
    *G02B 6/12*            (2006.01)

(52) U.S. Cl.
    CPC ......... *G02B 6/125* (2013.01); *G02B 6/12004* (2013.01); *G02B 2006/12104* (2013.01); *G02B 2006/12152* (2013.01)

(58) Field of Classification Search
    CPC ............... G02B 6/125; G02B 6/12004; G02B 2006/12104; G02B 2006/12152; G02B 3/1086; G02B 3/082; G02B 3/106; G02B 3/0809; G02B 3/105; G02B 5/142; G02B 1/0123; G02B 1/3536
See application file for complete search history.

(56) References Cited

U.S. PATENT DOCUMENTS

| | | | |
|---|---|---|---|
| 6,876,679 B1 * | 4/2005 | Bowler | G02B 6/29365 |
| | | | 372/101 |
| 6,906,309 B2 * | 6/2005 | Sayyah | H04B 1/0475 |
| | | | 359/278 |
| 8,831,056 B2 * | 9/2014 | Savchenkov | G04F 5/14 |
| | | | 372/18 |
| 9,252,560 B2 * | 2/2016 | Fermann | H01S 3/1115 |
| 9,450,673 B2 * | 9/2016 | Vahala | H03L 7/16 |
| 9,454,061 B1 * | 9/2016 | Abdo | H04B 10/70 |
| 9,537,571 B2 * | 1/2017 | Li | H04L 7/0091 |
| 9,685,761 B2 * | 6/2017 | Norberg | H01S 5/14 |

(Continued)

*Primary Examiner* — Andrew Jordan

(57) ABSTRACT

A technology is described for a Photonic Integrated Circuit (PIC) radio frequency (RF) oscillator. The PIC RF oscillator can comprise an optical gain media coupled to a first mirror and configured to be coupled to the PIC. The PIC can comprise a first optical cavity located within the PIC, a tunable mirror to form a first optical path between the first mirror in the gain media and the first tunable mirror, and a frequency tunable intra-cavity dual tone resonator positioned within the first optical cavity to constrain the first optical cavity having a common optical path to produce tow primary laser tones with a tunable frequency spacing. A photo detector is optically coupled to the PIC and configured to mix the two primary laser tones to form an RF output signal with a frequency selected by the tunable frequency spacing of the two primary tones.

24 Claims, 10 Drawing Sheets

(56) References Cited

U.S. PATENT DOCUMENTS

| | | | |
|---|---|---|---|
| 9,837,781 B2* | 12/2017 | Krishnamoorthy | H01S 5/4068 |
| 10,009,103 B2* | 6/2018 | Vahala | H03L 7/16 |
| 10,205,299 B2* | 2/2019 | Debnath | H01S 5/11 |
| 10,488,588 B1* | 11/2019 | Seyedi | G02B 6/12007 |
| 10,714,895 B2* | 7/2020 | Krishnamoorthy | G02F 1/2257 |
| 10,876,827 B2* | 12/2020 | Swanson | G01B 9/02069 |
| 11,050,214 B2* | 6/2021 | Loh | H01S 3/094069 |
| 11,177,624 B2* | 11/2021 | Cheung | H01S 5/1032 |
| 11,320,587 B2* | 5/2022 | Oldenbeuving | G02B 6/29343 |
| 11,409,185 B2* | 8/2022 | Kuse | G02F 1/353 |
| 11,600,963 B2* | 3/2023 | Nikolov | H01S 3/042 |
| 11,838,056 B2* | 12/2023 | Mokhtari-Koushyar | G02B 6/12007 |
| 2003/0089843 A1* | 5/2003 | Sayyah | H04B 1/0475 |
| | | | 250/227.21 |
| 2004/0062483 A1* | 4/2004 | Taghavi-Larigani | G02B 6/12007 |
| | | | 385/39 |
| 2004/0264977 A1* | 12/2004 | Yap | G02F 2/02 |
| | | | 398/161 |
| 2006/0050747 A1* | 3/2006 | Trutna | H01S 5/141 |
| | | | 372/20 |
| 2013/0016744 A1* | 1/2013 | Li | B82Y 20/00 |
| | | | 372/20 |
| 2015/0236784 A1* | 8/2015 | Vahala | H03B 17/00 |
| | | | 398/115 |
| 2015/0236789 A1* | 8/2015 | Vahala | H03L 7/16 |
| | | | 398/192 |
| 2016/0099546 A1* | 4/2016 | Norberg | G02B 6/12009 |
| | | | 385/24 |
| 2017/0012705 A1* | 1/2017 | Vahala | H04B 10/2575 |
| 2017/0307956 A1* | 10/2017 | Georges | G02F 1/3501 |
| 2017/0310075 A1* | 10/2017 | Debnath | H01S 5/141 |
| 2017/0324218 A1* | 11/2017 | Krishnamoorthy | H01S 3/10 |
| 2019/0027899 A1* | 1/2019 | Krishnamoorthy | H01S 5/021 |
| 2019/0341739 A1* | 11/2019 | Loh | H01S 3/2383 |
| 2020/0220317 A1* | 7/2020 | Rothberg | H01S 3/025 |
| 2021/0294180 A1* | 9/2021 | Kuse | G01S 7/4814 |
| 2021/0336409 A1* | 10/2021 | Nikolov | G04F 5/14 |
| 2021/0405290 A1* | 12/2021 | Hayenga | G02B 6/12007 |
| 2022/0326357 A1* | 10/2022 | Banerjee | G01S 17/931 |
| 2022/0344887 A1* | 10/2022 | De Valicourt | H01S 3/2383 |
| 2022/0404550 A1* | 12/2022 | Soltani | G02B 6/12004 |
| 2023/0130434 A1* | 4/2023 | Mokhtari-Koushyar | G02F 1/3513 |
| | | | 398/200 |
| 2024/0055826 A1* | 2/2024 | Nikolov | H01S 3/0637 |

* cited by examiner

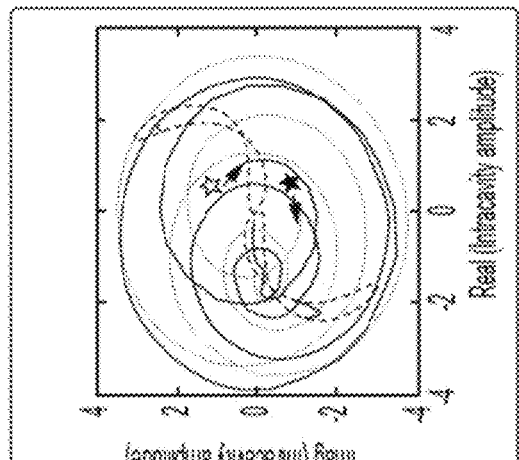
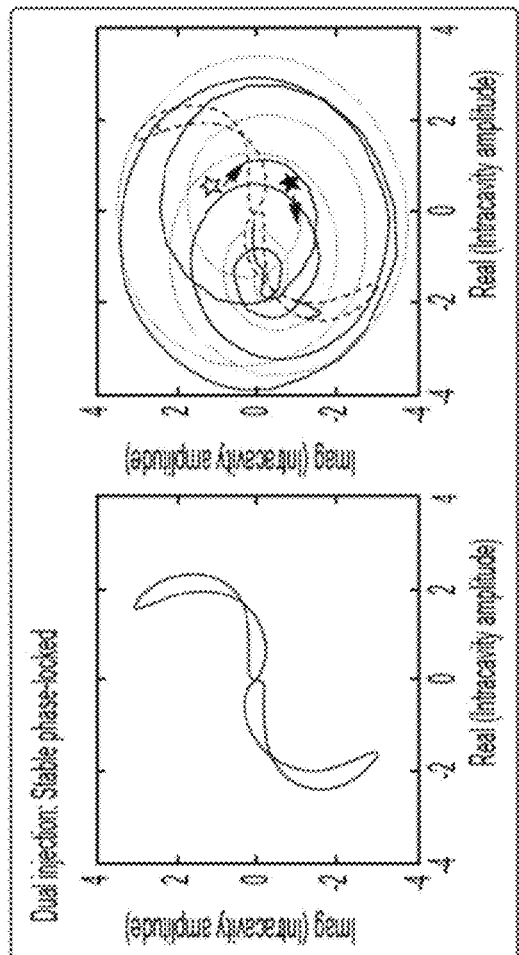
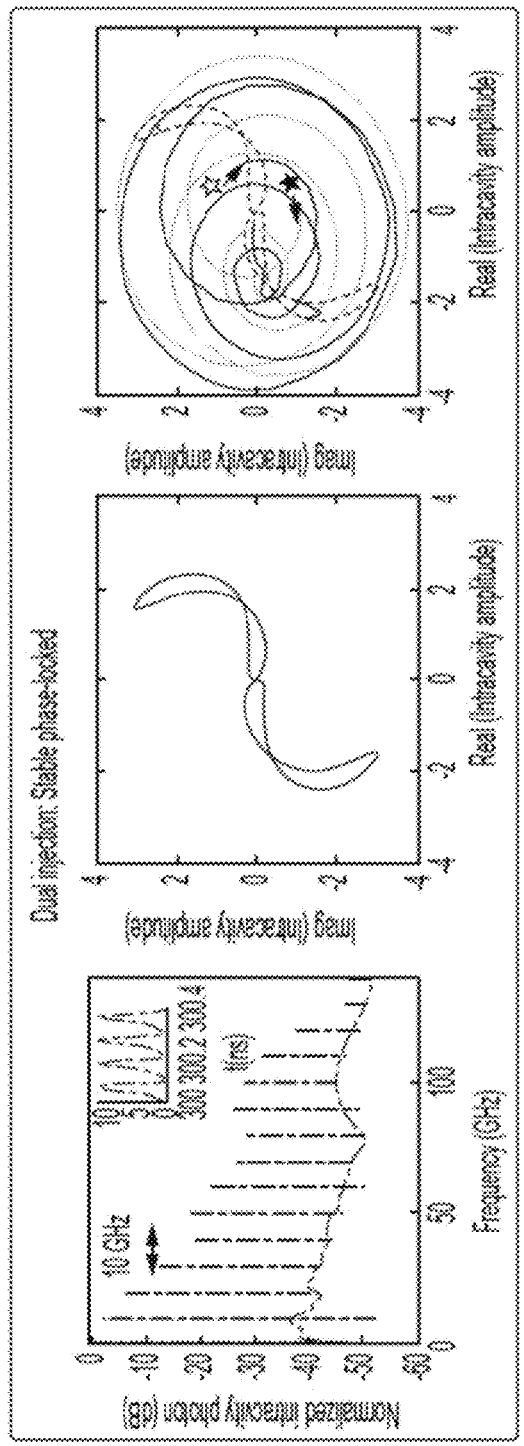
FIG. 6a FIG. 6b FIG. 6c
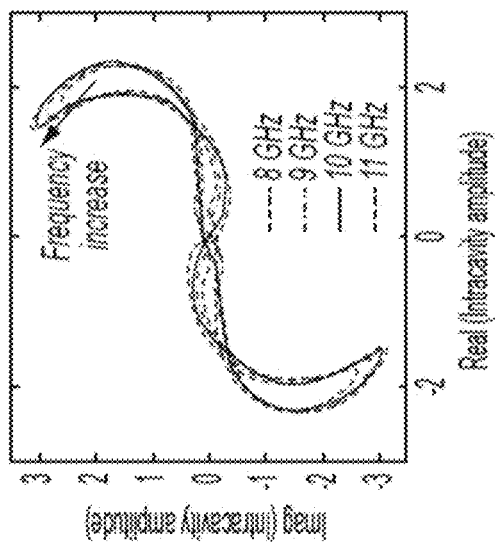
FIG. 7

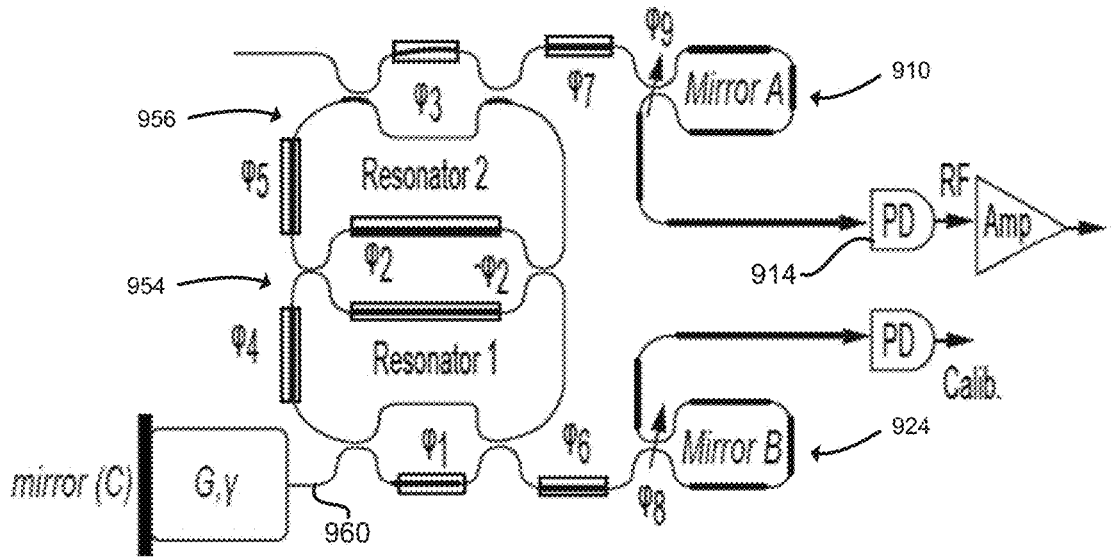

FIG. 9a

| Phase Shifter | Function/Purpose | Max power consumption |
|---|---|---|
| $\varphi_1, \varphi_3$ | Tune the coupling between Res1 and lower WG | 100 mW, 100 mW |
| $\varphi_2, \varphi_2$ | Tune the doublet spacing | 100 mW, 100 mW |
| $\varphi_4, \varphi_5$ | Adjust resonance misalignment due to for fab errors | 200 mW, 200 mW |
| $\varphi_6$ | Adjust the intracavity phase of lower path | 100 mW |
| $\varphi_7$ | Adjust the intracavity phase of upper path | 100 mW |
| $\varphi_8, \varphi_9$ | Adjust the reflectivity of the mirror | 100 mW, 100 mW |
| | | Total max power = 1.4 W |

FIG. 9b

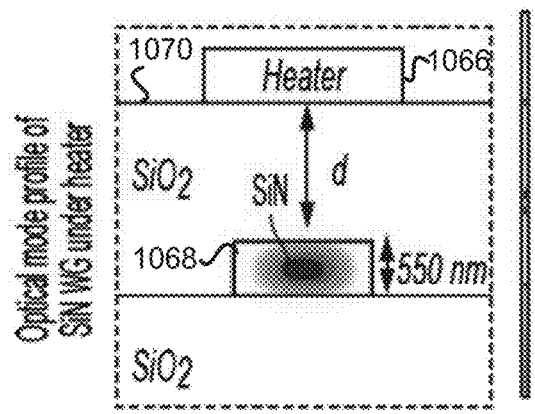

FIG. 10a

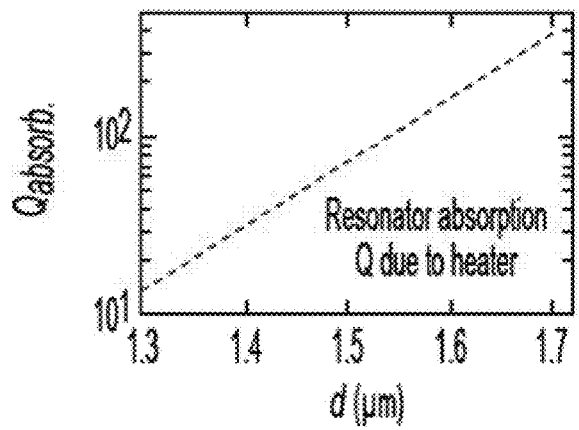

FIG. 10b

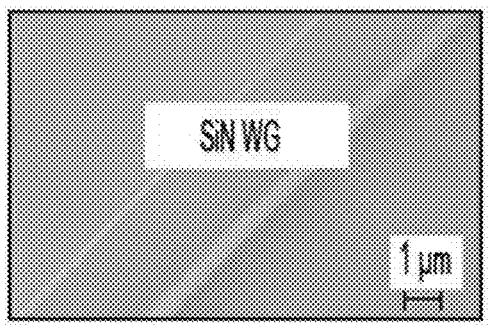

FIG. 10c

| | |
|---|---|
| SiN nominal WG height | 550 nm |
| SiN nominal WG width | 1.5-2 μm |
| Nominal bend radius | 50-100 μm |
| Expected intrinsic resonator Q | ~10M-20M |
| Nominal required resonator loaded Q for optimal POLARIS performance | 1-2 M |
| Nominal FSR of the SiN resonator | 80-100 GHz |
| Nominal 50:50 SiN splitter length | ~40 micron |
| Nominal distance between the metal heater to the SiN top surface | 1.5-2 μm |
| Nominal phase shifter (heater) length | 100-400 μm |
| Nominal phase shifter length for Q2 (doublet tuning) | 100-200 μm |
| Other SiN PIC design considerations (below): | |

FIG. 10d

PHOTONIC INTEGRATED CIRCUIT (PIC) RADIO FREQUENCY OSCILLATOR

RELATED APPLICATIONS

The present application claims the benefit of U.S. Provisional Patent Application No. 63/213,137 filed Jun. 21, 2021, the entire specification of which is hereby incorporated by reference in its entirety for all purposes.

BACKGROUND

Phase noise in a radio frequency (RF) signal produced by a radio frequency oscillator can limit the accuracy of the measurements performed using the RF signal. Phase noise is the result of random fluctuations in the phase of a waveform, corresponding to time-domain deviations from perfect periodicity.

In radar applications, the RF signal produced by the RF oscillator can be used as a clock reference signal. The clock reference signal is used to determine a time delay of the radar signal. The time delay is used to determine the range of the reflected RF signal by counting clock cycles from the edges of the clock signals.

The random fluctuations in the waveform of the RF oscillator caused by phase noise results in a randomness in the intended timing measurement, thereby potentially impacting detection and resolution of the return signal, and hence target detectability and measurement precision. Accordingly, a RF signal with a low level of phase noise is desirable for use in radar operations, including but not limited to range-Doppler radar systems such as Synthetic Aperture Radar (SAR) and Ground-Moving Target Indicator radar.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein:

FIG. 6a illustrates a diagram of a frequency spectrum of an intra-cavity energy with phase-locked harmonics in accordance with an example;

FIG. 6b illustrates a limit cycle plot of an imaginary vs real part of an intracavity amplitude in accordance with an example;

FIG. 6c illustrates limit cycles for two different starting points and their trajectory and convergence in accordance with an example;

FIG. 7 illustrates the tunability range of the photonic dual resonance RF oscillator system of FIG. 2a in accordance with an example;

FIG. 8c illustrates the frequency difference expected for a range of values of the doublet phase shifter of FIG. 8a;

FIG. 9a illustrates a photonic diagram with phase shifters to adjust coupling, doublet spacing, resonance misalignment, intracavity phase, and mirror reflectivity in the photonic dual resonance RF oscillator system in accordance with an example;

FIG. 9b is a table providing specific details for the phase shifters of FIG. 9a in accordance with an example;

FIG. 10a illustrates a simulated mode profile of a silicon nitride resonator waveguide in the presence of a micro-metal heater in accordance with an example;

FIG. 10b illustrates a diagram showing the effects of quality (Q) on the resonator due to absorption of the metals in the micro-metal heater of FIG. 10a in accordance with an example;

FIG. 10c illustrates an example of a silicon nitride waveguide of the photonic dual resonance RF oscillator system of FIG. 2a in accordance with an example;

FIG. 10d is a table providing specific details for the silicon nitride waveguides of FIG. 10c and the micro-metal heaters of FIG. 10b in accordance with an example;

Figure 1:
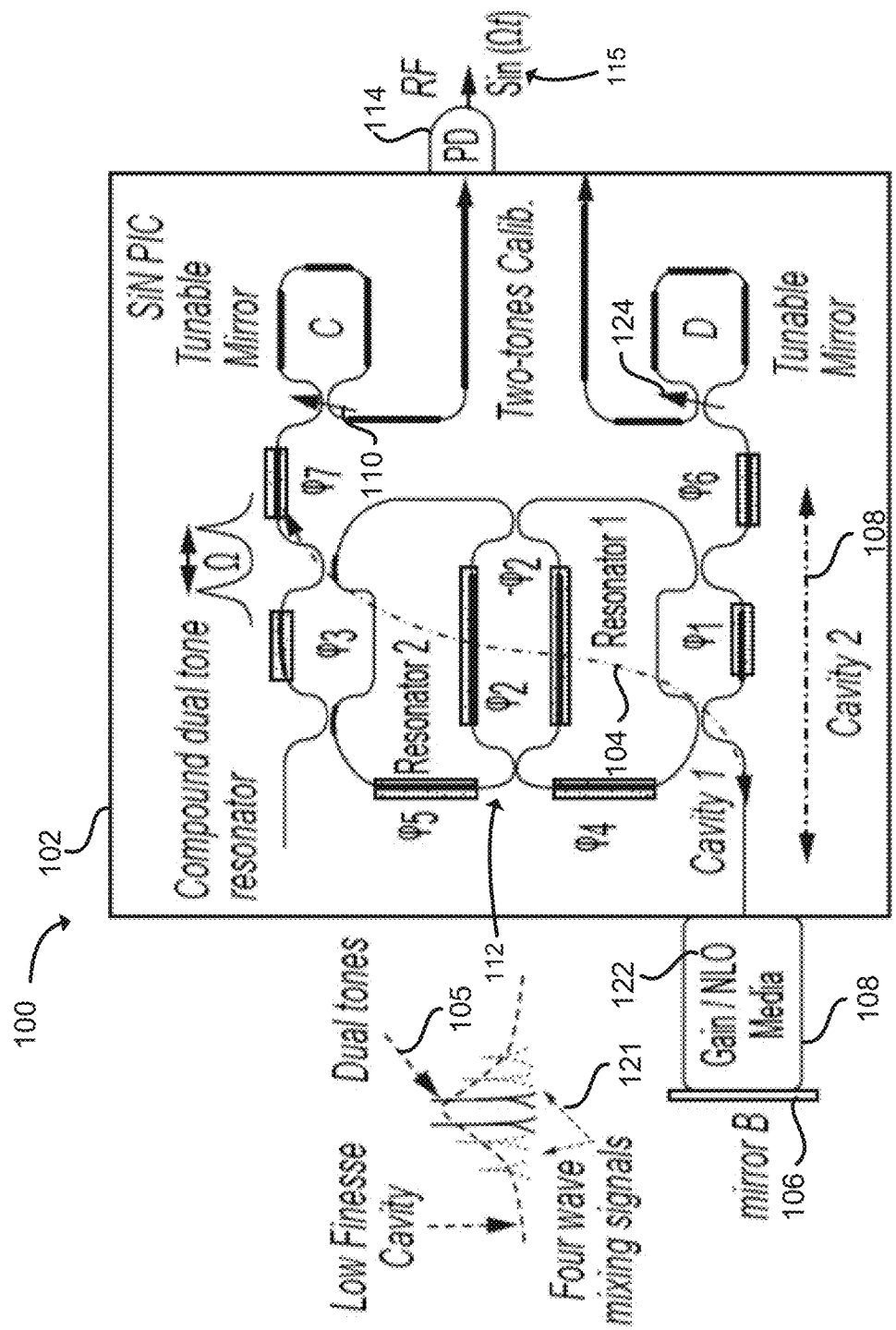
FIG. 1 illustrates an example embodiment of a photonic dual resonance Radio Frequency (RF) oscillator system in accordance with an example.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

A radio frequency signal source having a low phase noise can be helpful in a broad number of uses, including but not limited to, range-Doppler radio detection and ranging (radar) systems such as Synthetic Aperture Radar (SAR) and Ground-Moving Target Indicator radar, satellite communication links, navigation systems, precise metrological time and frequency measurements, reference clock distributions, and communication wireless links.

An opto-electronic oscillator can be used to produce a repetitive electronic sine wave or other type of continuous wave signal. An opto-electronic oscillator can have a very high quality factor (Q) as well as high frequency and phase stability. The quality factor, or Q factor, is a dimensionless parameter that describes how underdamped a resonator is. It is defined as the ratio of the initial energy stored in the resonator to the energy lost in one radian of the cycle of oscillation. A higher Q indicates a lower rate of energy loss and is an important indicator of efficiency and stability In an opto-electronic oscillator, the phase noise of the oscillator does not increase with the frequency, as can occur with different types of electronic oscillators, such as quartz crystal oscillators or air-dielectric resonators.

The accuracy and stability of an opto-electronic oscillator is determined by its phase noise, which in turn can be limited by a number of factors, such as thermo-refractive noise. Ultimately, the phase stability (and hence frequency linewidth) of the output is physically-limited by the Schawlow-Townes limit. Schawlow and Townes calculated the fundamental (quantum) limit for the linewidth of a laser. The Schawlow-Townes linewidth can be determined by the strength of fluctuations of the optical phase, which are caused by quantum noise. The phase noise level corresponding to the Schawlow-Townes linewidth is, in part, a result of spontaneous emission into the laser mode.

In accordance with one embodiment of the present invention, a photonic dual resonance RF oscillator is disclosed that combines state-of-the-art photonic integrated circuit (PIC) technology using ultra-low loss optical resonators, in combination with low-noise electronics and advanced chip-scale packaging to provide an RF oscillator with substantially low phase noise. The RF oscillator can be packaged in a small, thermally regulated system that can be used in demanding physical environments.

One embodiment of the architecture is configured to generate a continuously tunable, low-phase noise RF signal by interfering the optical output of an innovative PIC-based two-tone common cavity laser. The laser reduces the non-correlated phase noise for each lasing mode by constraining the modes to a common optical path. The common optical path, and a mixed output, effectively eliminates the impact of most classical noise sources within a laser, such as thermos-refractive noise (TRN).

The PIC-based two-tone common cavity laser can include a first optical cavity that includes a frequency tunable compound intra-cavity resonator. The compound intra-cavity resonator can be formed of silicon nitride (SiN), or another desired material that is used to form the PIC. The frequency tunable compound intra-cavity resonator is configured to constrain the first optical cavity to produce two primary tones with tunable frequency spacing. When these two primary tones are mixed, their correlated phase noise cancels and the resulting RF tone approaches the Schawlow-Tones limited noise floor.

For further phase noise reduction, the PIC can include a second optical cavity that is optically coupled to the first optical cavity. The two primary tones from the first optical cavity can be used to injection-seed the second optical cavity. The two primary tones can be used to drive a phase-conserving nonlinear intra-cavity four-wave mixing (FWM) process in a semiconductor gain medium that generates two secondary tones in addition to the two primary tones. This second optical cavity can be designed such that the secondary tones produce feedback to effectively constrain the phases of the two primary injected tones.

Four-wave mixing (FWM) is an intermodulation occurrence in nonlinear optics, wherein interactions between two or three wavelengths produce two or more new wavelengths. It is a parametric nonlinear process, in that the energy of the incoming photons is conserved. FWM is a phase-sensitive process, in that the efficiency of the process is strongly affected by phase matching conditions.

In one embodiment, cavity feedback and gain are configured to enable the secondary tones to have an increased intensity to drive additional FWM processes. This leads to both a cascading sequence of additional FWM tones as well as direct feedback to the primary tones. The feedback constrains the phase of the primary tones, and increases the correlation of their phase noise, thereby enabling the uncorrelated-phase noise to fall below the Schawlow-Townes limit. The RF signal with the phase noise below the Schawlow-Townes limit can be used to substantially improve radar, communication, navigation, measurements, and clock references.

FIG. 1 illustrates an example embodiment of a photonic dual resonance Radio Frequency (RF) oscillator system 100. The system 100 comprises a photonic integrated circuit (PIC) 102 having a first optical cavity 104 that is configured to be coupled to a gain media 108 having a mirror 106. In one example, the PIC can be formed of a silicon dioxide ($SiO_2$) base with silicon nitride (SiN) waveguides carried on the base. This is not intended to be limiting. The waveguides can be formed of any optical material with low loss that can be used to carry optical signals.

The gain media 108 in FIG. 1 can be located external to the PIC 102, or integrated on the PIC 102, or formed within the PIC 102. The gain media 108 can be a linear gain media or a non-linear gain media. In one embodiment, the gain media can be a reflective semiconductor optical amplifier, or another desired type of laser gain media. The PIC 102 can further comprise a first tunable mirror 110 to form the first optical cavity 104 between the mirror 106 in the gain media 108 and the first tunable mirror 110.

The PIC 102 can further comprise a frequency tunable intra-cavity dual tone resonator 112 positioned within the first optical cavity 104 to constrain the first cavity to produce two primary laser tones 105 with a tunable frequency spacing, the two primary laser tones 105 having a substantially-common optical path within the first optical cavity 104. The common optical path length may be tuned to have substantially similar lengths using a phase adjuster on a waveguide in the optical path. The common optical path constraint for the two primary laser tones 105 cancels many of the common-mode noise sources reported in the literature when the two primary tones 105 are interfered to create a tone with a frequency that represents the difference between the two primary laser tones 105. The phase noise of the difference tone can approach the classical Schlalow-Townes limit.

The PIC 102 can further comprise a photo detector 114 that is optically coupled to an output of the PIC 102 and configured to receive the two primary laser tones 105 from the first tunable mirror 110 and mix the two primary laser tones 105 to form an RF output signal 115 with a frequency determined by a difference of the tunable frequency spacing of the two primary laser tones 105. The photodetector 114 can be directly coupled to an output of the first tunable mirror 110. The photodetector 114 can be resident on the PIC 102 or it can be located external to the PIC 102 and an output signal transmitted by the first tunable mirror 110 can be relayed to the photodetector 114 through either free-space or waveguide coupling.

In another embodiment, the PIC 102 in the photonic dual resonance RF oscillator system 100 can further comprise a second optical cavity 120 within the PIC 102, and an intracavity element providing non-linear optical (NLO) gain 122. Depending on the material and wavelength selections, the NLO gain can be provided by the laser media 108, a separate material element optimized to provide NLO gain, or by a waveguide material within the PIC 102.

The PIC 102 can further comprise a second tunable mirror 124 that is optically coupled to define the second optical cavity 120 to form a second optical path between the mirror 106 in the gain media 108 and the second tunable mirror 124. The second optical cavity 120 can be optically coupled with the first optical cavity 104 to enable the two primary 105 laser tones to be directed to the second optical path.

In one embodiment, the two primary laser tones 105 are injected into the second optical cavity 120 from the first optical cavity 104 and the second optical cavity 120 is configured to provide four wave mixing (FWM) 121. The injection can be accomplished by using any component that supports partial reflectivity and/or transmission (i.e. beam splitting) with minimal absorption loss, such as a fixed or adjustable multimode interference coupler. The four wave mixing process uses the two primary tones 105 to produce two secondary tones via the NLO gain 122. The physical constraints of energy and momentum conservation constrain the phase relationships of the secondary tones. In turn, the presence of the secondary tones constrains the phase of the primary tones. The result of imposing these constraints on the phases of the various tones is referred to as phase locking. The phase locking of the two primary laser tones has the effect of reducing the phase jitter and drift (phase noise) in the two primary laser tones. This process can be cascaded to produce tertiary or additional tones. When employed, these additional tones can provide additional phase constraints to further reduce phase noise in the two primary laser tones. The addition of the second optical cavity 120 coupled to the first optical cavity 104 within the PIC 102 and the intracavity element providing non-linear optical (NLO) gain 122 can allow the system phase noise to improve relative to the classical Schlalow-Townes limit.

In one example, the photonic RF oscillator system 100 can start as a free-running laser in the first optical cavity 104, then transition to a phase-locked operation to achieve a reduced level of phase noise using FWM in the second optical cavity 120. While multiple tones are present in the common optical path shared by the first optical cavity 104, only the two primary laser tones 105 pass through the frequency tunable intra-cavity dual tone resonator 112. This creates positive feedback at these two primary tones 105 and enables the two tones to be used to create an RF signal with low phase noise at the output of the photodetector 114.

Figure 2A:
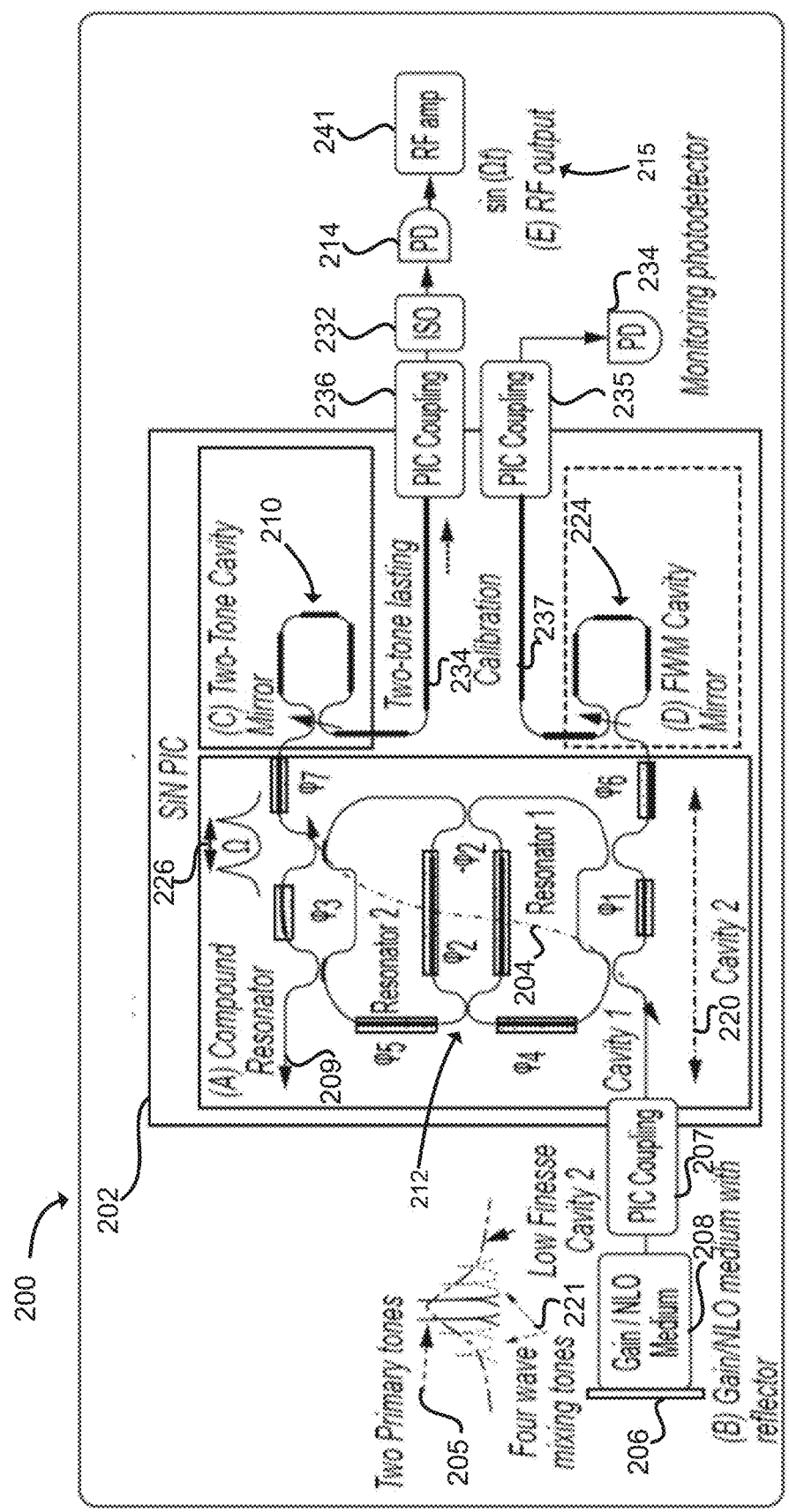
FIG. 2a illustrates a photonic dual resonance RF oscillator system in accordance with another example.

FIG. 2a provides an example illustration of a photonic dual resonance RF oscillator system 200. The system 200 is comprised of two coupled cavities, the first optical cavity 204 and the second optical cavity 220. The two cavities can share common elements, such as a laser gain medium 208. The laser gain medium 208 can be resident on the PIC 202 or it can be located external to the PIC 202 and an output signal transmitted from the laser gain media 208 can be relayed to the first optical cavity 204 via PIC coupling 207 through either free-space or waveguide coupling. The common elements shared between the two cavities 210, 220 can provide frequency tuning and strong phase noise reduction. In one example, the PIC 202 can use ultra-low loss SiN waveguides 209 to route the laser light. Controllable phase delays (phase shifters), $\varphi 1$ through $\varphi 7$, can be used to adjust waveguide coupling to enable the system 200 to operate in a stable region.

The first optical cavity 204 is configured to generate two primary laser tones 205 having strongly correlated noise. The two primary laser tones are separated in frequency by $\Omega$ Hertz 226. The output RF signal has the same frequency as the primary laser tone separation, with an RF signal output 215 of $\sin(\Omega t)$. The RF signal output 215 can be amplified using an amplifier, such as a low noise amplifier 241 The design of the first optical cavity 204 constrains all modes to a common path to reduce phase noise. The first optical cavity provides a common optical path that includes a mirror 206 in the laser gain media 208. The laser gain media 208 and mirror 206 can be shared with the second optical cavity 220. In one embodiment, the laser gain media 208 can include a semiconductor gain media to provide gain for the two primary laser tones 205 and the secondary FWM tones 221 in the second optical cavity 220. The mirror 206 can be a highly reflective mirror configured to reflect both the two primary laser tones 205 in the common optical path with a tunable reflectivity mirror 210 that can be configured as a Sagnac loop mirror and used to form the two primary laser tones along the common optical path, and the secondary FWM tones 221 on the second optical path between the mirror 206 and the FWM cavity mirror 224. The FWM cavity mirror 224 can be a tunable mirror based on a Sagnac loop. The laser gain media 208 can also include a nonlinear optical element, as previously discussed. Alternatively, the nonlinear optical element can be included in the second cavity 222, the FWM cavity mirror 224, or within the waveguide along the second optical path between the mirror 206 and the FWM cavity mirror 224. The nonlinear optical element can provide, along with the gain media 208, the FWM of the two primary laser tones 205 to form the secondary FWM tones 221. In one embodiment, the output of the FWM cavity mirror can be a calibration output 237 that can be output from the PIC 202 to a photodetector 239 that can be used for monitoring. The monitoring photodetector can be used to analyze the optical signals in the PIC and for adjusting the various phase shifters to create the two primary laser tones 205 and to form the secondary FWM tones 221.

An optical isolator 232 can be coupled to an output of the PIC 202 and located between the PIC 202 and the photodetector 214 to optically isolate the PIC from the photodetector. The optical isolator can substantially reduce reflected light from the photodetector 214 from re-entering the PIC 202. Residual back reflection to an oscillator can increase phase noise. In addition, the waveguide 234 can be angled at the coupling 236 at the exit of the PIC 202 using baseline angled waveguide coupling to reduce back reflection from the photodetector to the PIC 202. In one embodiment, the angled coupling may be sufficient and the optical isolator is not 232 needed. However, if back reflection causes an undesired amount of the phase noise, then the optical isolator 232 can be used to reduce the phase noise caused by back reflection. A similar coupling 235 can be used to couple the photodetector 234 to the calibration output 237.

In one embodiment, a photonic dual resonance RF oscillator system 200 can include a frequency tunable intra-cavity dual tone resonator 212 that is located within the first optical cavity 204. The frequency tunable intra-cavity dual tone resonator 212 can be an ultrahigh Q coupled resonator formed of SiN with tunable doublet resonance serving as an intra-cavity etalon. The doublet frequency spacing provides the frequency of the RF signal output of the photo detector 214. The doublet frequency spacing can be selected by adjusting $\varphi 2$ and $-\varphi 2$. The first cavity 204 also comprises phase shifters $\varphi 1$, and $\varphi 3$ to $\varphi 7$.

The phase shifters $\varphi 2$ and $-\varphi 2$ can used to adjust the cavity free spectral range (FSR). The FSR is the spacing in optical frequency between the two primary tones. The phase shifters $\varphi 1$, and $\varphi 3$ to $\varphi 7$ can also be used to adjust waveguide coupling, compensation for fabrication errors in the dual resonators, and to adjust optical coupling between the first optical cavity 210 (two-tone cavity) and the second optical cavity 220 (FWM cavity). The phase shifters $\varphi 1$, and $\varphi 3$ to $\varphi 7$ will be discussed more fully in the proceeding paragraphs.

Figure 2B:
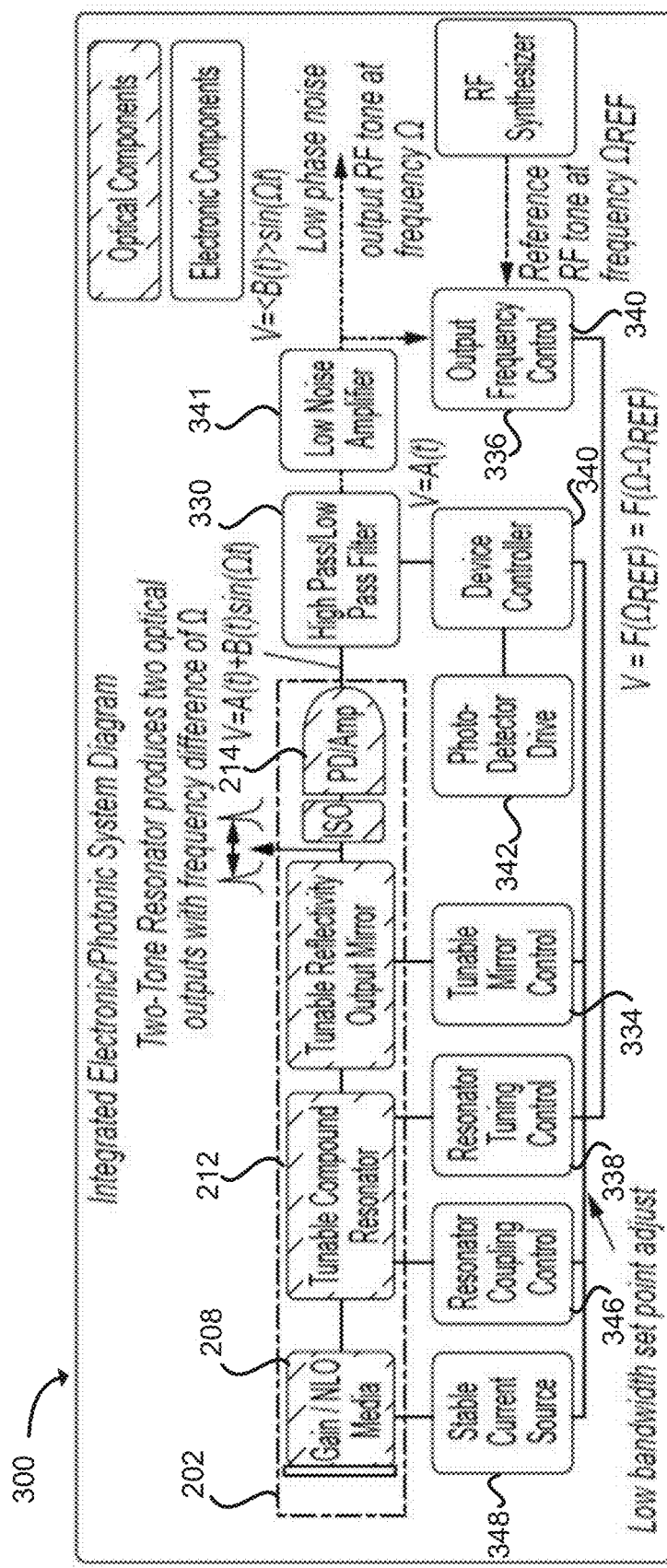
FIG. 2b illustrates a functional block diagram of an electronics subsystem capable of supporting operation of the photonics oscillators depicted FIGS. 1 and 2 in accordance with an example.

FIG. 2b illustrates an example of a functional block diagram of an electronics subsystem 300 configured to be coupled to the photonic dual resonance RF oscillator system 200. The electronics subsystem can include a high pass and/or low pass filter 330 that filters the RF output signal of the photo detector 214 in the photonic dual resonance RF oscillator system 200. The filtered RF output signal can be sent to a low noise amplifier 341 to produce a low phase noise output RF tone with a frequency of $\Omega$ Hz.

In one embodiment, an RF synthesizer 334 can be used to send a reference RF tone at a frequency of $\Omega_{REF}$ to an output frequency control 336. The output frequency control 336 can also receive an input of the low phase noise output RF tone from the low noise amplifier 341. The output frequency control 336 can send a signal $V=F(\Omega_{DIF})=F(\Omega-\Omega_{REF})$ to a resonant tuning control 338 that is used to adjust the tunable compound resonator 212 to produce the two primary tones 205 that are separated by the frequency $\Omega$.

The output of the photo detector 214 in the photonic dual resonance RF oscillator system 200 can be the signal $V=A(t)+B(t)\sin(\Omega t)$. The high pass/low pass filter 330 can send the signal $V=A(t)$ to a device controller 340. The feedback signal $V=A(t)$ can be used by the device controller to send a feedback signal to a photo-detector drive 342, a tunable mirror control 344, a resonator coupling control 346, and a stable current source 348. The stable current source 348 can use the feedback signal to provide a selected amount of current to the gain media 208 to control the amplitude of the laser light in the PIC 202, and the corresponding amplitude of the two primary tones 205 and the FWM tones 221. The resonant coupling control 346 can use the feedback signal to send a control signal to the tunable compound resonator 212 to adjust the frequency separation $\Omega$ of the two primary tones. The tunable mirror control can be used to adjust the amount of laser light allowed to pass through the FWM cavity mirror 224 (FIG. 2) and/or the two-tone cavity mirror 210.

The electronics subsystem 300 is configured to fulfill four primary functions. It can (1) operate a phase-locked loop (PLL) which controls the RF frequency output of the photonic dual resonance RF oscillator system 200; (2) provide sufficient internal isolation to prevent self-interference between various subsystems in the photonic dual resonance RF oscillator system 200; (3) support an integration flow that keeps the components operating within safe fabrication exposure limits to temperature during fabrication and subsystem testing prior to integration; and (4) provide sufficient attenuation of environmental perturbations, such as thermal, vibrational, electromagnetic, etc., so that internal components are maintained within predetermined operating ranges.

Figures 3A, 3B:
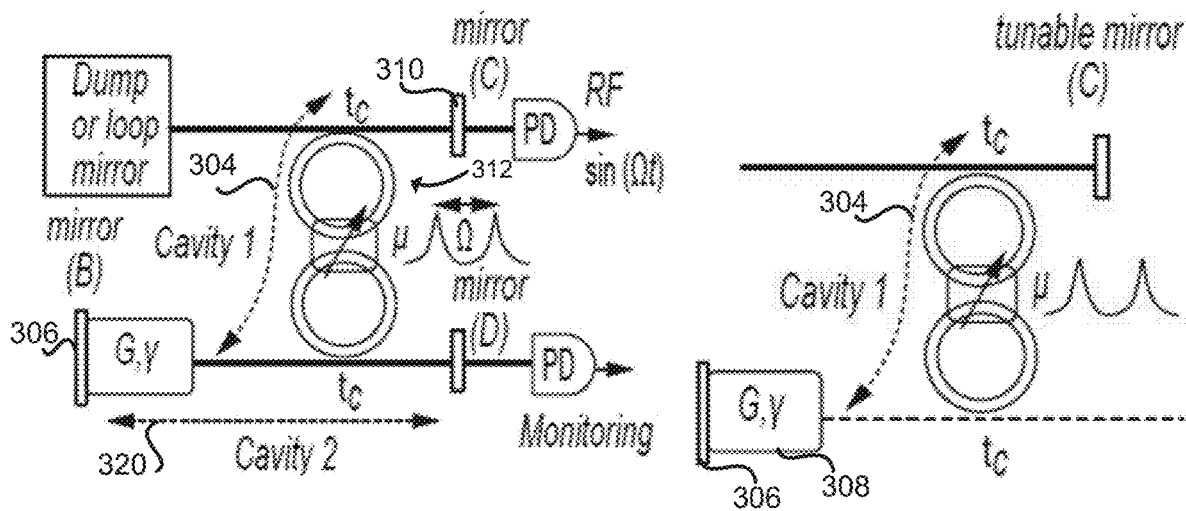
FIG. 3a illustrates a photonic diagram with dual tone lasing and four wave mixing in accordance with an example.
FIG. 3b illustrates the dual tone lasing block of FIG. 3a in accordance with an example.
Figure 3C:
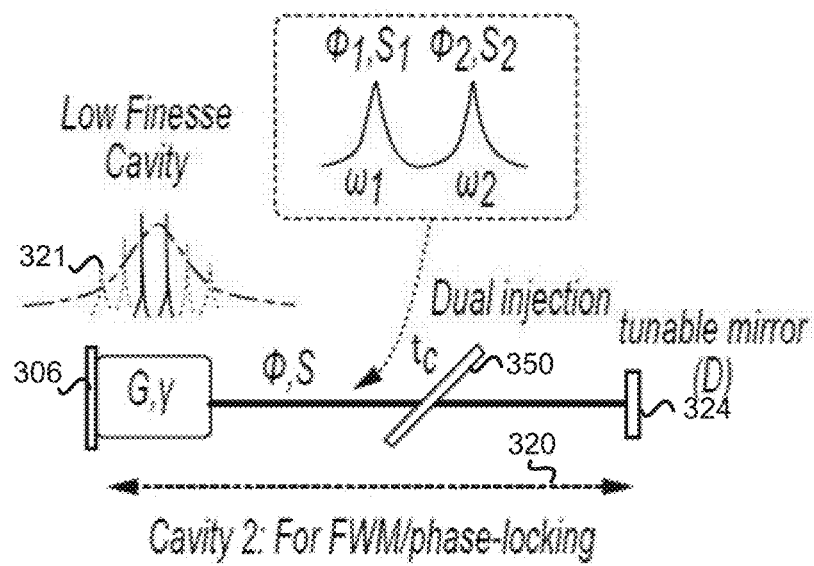
FIG. 3c illustrates the four wave mixing block of FIG. 3a in accordance with an example.

FIGS. 3a-3c provide additional details of the laser cavities in the PIC 202 (FIG. 2). FIG. 3a illustrates that the PIC 202 can include two laser structures sharing one gain media 308 and a mirror 306. One laser, comprising the first optical cavity 304 for dual tone lasing to produce the two primary tones 205 (FIG. 2) with a frequency difference of $\Omega$. The second optical cavity 320 is for FWM and phase locking and subject to dual-tone injection from the first optical cavity 304.

FIG. 3b illustrates an example of the first optical cavity 304 for dual tone lasing. FIG. 3b also illustrates a simpler embodiment of the dual-resonance oscillator, which does not use the four wave mixing component. The simpler embodiment is much simpler and less expensive to construct than the systems illustrated in FIGS. 1 and 2a. This would be an excellent configuration to use in cost-challenged shorter range systems, such as unmanned aerial vehicles or hand-held units.

The laser cavity comprises the mirror 306 of the gain medium 308 to the tunable mirror 310. The tunable compound resonator 312 has a coupling coefficient $\mu$ between the resonators. The dual-tone resonance can act as a coupled-etalon with two resonances to provide the dual tone lasing.

The first optical cavity 304 can be a high finesse cavity. The finesse of an optical resonator (cavity) is a measure for how narrow the resonances are in relation to their frequency distance: a high finesse means sharp resonances. It is defined as the free spectral range (FSR) (i.e., the fundamental mode spacing) divided by the full width at half-maximum (FWHM) bandwidth of the resonances. It is fully determined by the resonator losses and is independent of the resonator length.

FIG. 3c illustrates an example of the second optical cavity 320 for FWM and phase-locking of the two primary tones, illustrated in this example with an intrinsic resonance frequency of $\omega_1$ and $\omega_2$. The dual-tones can be injected from any configuration of a dual-tone oscillator. The first primary tone, with an intrinsic resonance frequency of $\omega_1$, has an intracavity photon number of $S_1$ and a phase of $\varphi_1$ in the second optical cavity 320. The second primary tone, with an intrinsic resonance frequency of $\omega_2$, has an intracavity photon number of $S_2$ and a phase of $\varphi_2$ in the second optical cavity 320. A dual lasing block 350 acts as a dual-injection source at a rate of $\tau_c$ the lower laser cavity for FWM 321 and phase locking. The dual lasing block 350, illustrated as a notional 45-degree angle mirror, is merely representative of the coupling between the first optical cavity 304 and the second optical cavity 320. The coupling between the cavities 304, 320 is selective to the two primary tones, which are dual resonances of the first optical cavity 304.

The second optical cavity 320 in FIG. 3c is seeded with the dual-tone injection from the first optical cavity 304 of FIG. 3b. The second optical cavity 320 uses a strong non-linearity to perform the FWM mixing between the injected laser tones to generate the FWM sidebands. This non-linearity significantly relaxes the desired Q for such a FWM process and results in phase locking between the two primary tones, which correlates and reduces their relative quantum phase noise. Accordingly, the second optical cavity can have a low finesse. Effectively, the second optical cavity 320 acts as a phase-locked cavity. The dual-tone injection seeding of this cavity controls the frequency of its tones. By injecting sufficient power in the dual-tone injection from the first optical cavity 304, the desired frequencies $\omega_1$ and $\omega_2$, and associated phases $\varphi_1$ and $\varphi_2$, are effectively given a compelling head start in the amplification process and become the dominant output frequency and phase of the laser in the second optical cavity 320 between the mirror 306 and the tunable mirror 324. As previously discussed, the non-linear material may be included with the gain media 308, the tunable mirror 324, the waveguide, or another desired location within the second optical cavity 320.

Figure 4A:
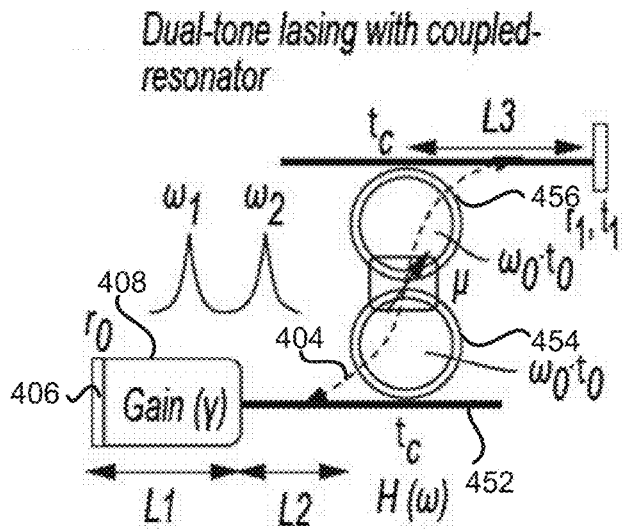
FIG. 4a illustrates a photonic diagram of dual-tone oscillator with a coupled resonator in accordance with an example.
Figure 4B:
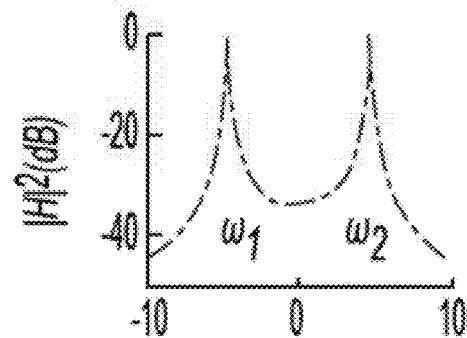
FIG. 4b illustrates a diagram of a transfer function of a coupled resonator in accordance with an example.
Figure 4C:
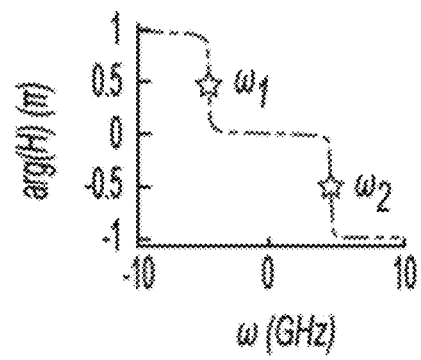
FIG. 4c illustrates a diagram of resonant frequencies of the coupled resonator in accordance with an example.

FIGS. 4a-4c are illustrative examples used to show a dual tone lasing condition for a coupled resonator structure, in accordance with an embodiment. In FIG. 4a, four wave mixing is not included. The gain media 408 has a gain $\gamma$, a length L1, and a mirror 406 with a reflectivity of $r_0$. A tunable compound resonator 412 is comprised of a first resonator 454 and a second resonator 456 in the first optical cavity 404. The first and second resonators 454, 456 have an intrinsic resonant frequency of $w_0$, a decay rate of $\tau_0$, and a coupling coefficient of $\mu$ between the resonators 454, 456. A waveguide 452 coupled to the gain media 408 has a waveguide-resonator coupling decay rate of Tc and a length L2 to the first resonator 454. A waveguide 458 has a length L3 from the second resonator 456 to the tunable mirror 410. The tunable mirror 410 has a reflectivity $r_1$.

The transfer function for the coupled resonator 412 illustrated in FIG. 4a is:

$$H(\omega) = \frac{j2\mu/\tau_c}{\left[j(\omega - \omega_0) + \frac{1}{\tau_c} + \frac{1}{\tau_0}\right]^2 + \mu^2} \quad \text{(Eq. 1)}$$

FIG. 4b illustrates a graph of the absolute value of the transfer function, showing the two primary tones with an intrinsic resonance frequency of $\omega_1$ and $\omega_2$.

For lasing to be performed, Equation 2 is to be satisfied:

$$r_0 r_1 |H(\varepsilon)|^2 = e^{2\alpha(L_1+L_2+L_3)-2\gamma L_1} \cos[2 \arg(H(\varepsilon))] \quad \text{(Eq. 2)}$$

where $\alpha$ is a gain coefficient.

FIG. 4c illustrates a graph showing the arg(H($\pi$)). For dual tone lasing to be performed, Equation 3 is to be satisfied:

$$\cos[2 \arg(H(\varepsilon_1))] = \cos[2 \arg(H(\varepsilon_2))] \quad \text{(Eq. 3)}$$

Equation 3 is satisfied when there is a phase difference of it between $\omega 1$ and $\omega 2$. Accordingly, by configuring the first optical cavity with the tunable compound resonator 412 to provide a phase difference of $\pi$ between $\omega 1$ and $\omega 2$, the two primary tones $\omega 1$ and $\omega 2$ will intrinsically be reinforced and other tones attenuated.

Figure 5A:
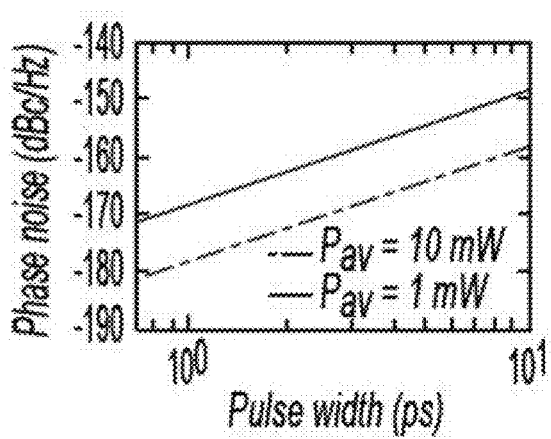
FIG. 5a illustrates a diagram of a quantum limited phase noise expected for a mode-locked laser over a range of pulse widths in accordance with an example.
Figure 5B:
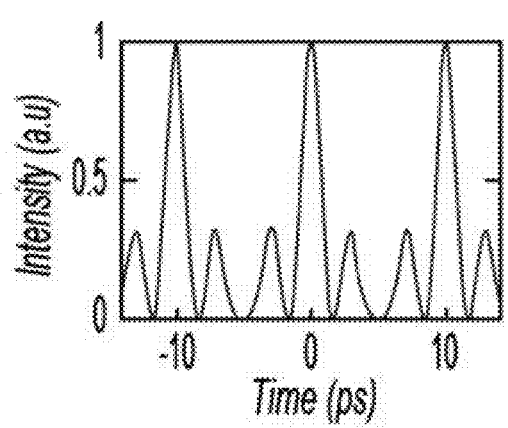
FIG. 5b illustrates a diagram of a modeled temporal behavior of a system with four-mode locked tones in accordance with an example.

FIG. 5a provides an illustration of an exemplary graph showing a quantum limited phase noise of a mode-locked laser for different pulse widths for the average powers of 1 milliwatt (mW) and 10 mW. FIG. 5b illustrates provides an illustration of an exemplary graph showing a model of the temporal waveform of four locked laser modes. The modeled temporal behavior of a system with four-mode locked tones predicts a pulse width of 2 picoseconds (ps). Such a pulse width, in FIG. 5a, implies a phase noise limit of less than −160 dBc/Hz. The term dBc is the decibels relative to the carrier, which shows the power ratio of a signal to a carrier signal, expressed in decibels. Phase noise is expressed in dBc/Hz at a given frequency offset from the carrier. The phase noise limit of less than −160 dBc/Hz indicates that the locking of four modes in the second optical cavity is sufficient to produce a strong quantum noise correlation. The FSR for the simulation illustrated in FIGS. 5a and 5b is 100 gigahertz (GHz). The examples in FIGS. 5a and 5b are not intended to be limiting. Different four-mode locked tones with different pulse widths and different levels of phase noise are possible, depending on the system specifications. In one embodiment, the phase noise in the RF output signal (215 FIG. 2a) can be between −120 dBc/Hz and −160 dBc/Hz. Alternatively, the phase noise in the RF output signal 215 can be as low as −165 dBc/Hz.

Based on the results illustrated in the graph of FIG. 5b, it can be concluded that a minimum of four tones can be used to participate in the FWM process (i.e. the dual injected tones and the two FWM sidebands) to achieve ultralow phase noise. An additional constraint arises based on the finesse of the second optical cavity, which results in two potential operating configurations, referred to herein as Configuration 1 and Configuration 2.

In Configuration 1, the second optical cavity is configured as a low finesse cavity. In this case, the injected dual tones and the generated FWM sidebands fall under the FWHM of the second optical cavity. Using this configuration, the spacing between the dual-tones can be continuously tuned, thereby creating a voltage controlled oscillator (VCO) where the differential output frequency is electronically-controlled. The low finesse can be achieved by lowering the reflectivity of the tunable mirror 324 (FIG. 3c). As a result of the reduced reflectivity, the net system power efficiency is decreased relative to Configuration 2.

In configuration 2, the second optical cavity is configured as a high finesse cavity. For optical injection seeding, the frequency separation of the two primary tones injected by the first optical cavity is approximately equal to a multiple of the FSR of the second optical cavity. An RF oscillator generated by this configuration can be a step-wise tunable oscillator with a step size commensurate with the second optical cavity's FSR. Fine thermal tuning of the first optical cavity path length can be performed to match the FSR of the first optical cavity with the injected dual-tone frequency spacing to provide a small range of tunability around each step. The second configuration can be more power efficient, but potentially noisier than Configuration 1. The second configuration also uses more control precision than Configuration 1. The second configuration can also benefit from a relatively long cavity, which will decrease the FSR and provide more tuning steps.

Equations 4-7, shown below, provide a set of dynamical nonlinear equations governing dual-tone injection seeding of a semiconductor laser cavity. The equations are normalized to the steady-state free running laser parameters prior to external injection. Three dynamical parameters are the normalized intracavity photon number ($\tilde{S}(t)$) and its phase ($\phi(t)$), and the normalized free carrier density ($\tilde{n}(t)$). This analysis does not include any effects applicable to higher power operation.

$$\frac{d\tilde{S}}{dt} = (\Gamma g - \gamma)\tilde{S} + \quad \text{(Eq. 4)}$$

$$\frac{2\sqrt{\tilde{S}}}{\tau_c}\left[\sqrt{\tilde{S}}\cos(\Omega_1 t + \phi_1 - \phi) + \sqrt{\tilde{S}}\cos(\Omega_2 t + \phi_2 - \phi)\right] + R_{sp}$$

$$\frac{d\phi}{dt} = \frac{\Gamma g \beta_c}{2} + \quad \text{(Eq. 5)}$$

$$\frac{1}{\tau_c}\left[\sqrt{\frac{\sqrt{\tilde{S}_1}}{\sqrt{\tilde{S}}}}\sin((\Omega_1 t + \phi_1 - \phi)) + \right]\sqrt{\frac{\sqrt{\tilde{S}_2}}{\sqrt{\tilde{S}}}}\sin((\Omega_2 t + \phi_2 - \phi))$$

$$\frac{d\tilde{n}}{dt} = -(\gamma_s + \gamma_n \tilde{S})\tilde{n} + \frac{\gamma_s \gamma_p}{\gamma_c}\tilde{S}(\tilde{S}-1)\tilde{j} - \gamma_s(\tilde{S}-1)\tilde{j} \quad \text{(Eq. 6)}$$

$$g = \frac{\gamma_c}{\Gamma} + \gamma_n \frac{N_0}{S_0}(\tilde{n}-1) - \frac{\gamma_c}{\Gamma}(\tilde{S}-1) \quad \text{(Eq. 7)}$$

The intracavity photon number rate and phase equations are shown in Eq. 4 and Eq. 5, respectively. $\tilde{S}$, $\tilde{S}_1$, and $\tilde{S}_2$ are the photon numbers in the second optical cavity and the photon numbers for the injected dual modes normalized to $\tilde{S}_0$, which is the intracavity photon number of the free running cavity. The gain is denoted as g, $\Gamma$ is the confinement factor, $\gamma$ is the cavity loss, and $R_{sp}$ is the spontaneous emission rate. $\phi$, $\phi_1$, and $\phi_2$ are the phases of the lower intracavity mode and the dual injection modes. $\beta_c$ is the Henry linewidth enhancement factor. As previously discussed with reference to FIG. 3, the first primary tone, with an intrinsic resonance frequency of $\omega_1$, has an intracavity photon number of $S_1$ and a phase of $\phi_1$ in the second optical cavity. The second primary tone, with an intrinsic resonance frequency of $\omega_2$, has an intracavity photon number of $S_2$ and a phase of $\phi_2$ in the second optical cavity.

FIGS. 6a-6c show preliminary simulation results for an injection seeded low finesse cavity (the second optical cavity) with non-linear mixing and phase-locking in the semiconductor. FIG. 6a shows the generation of cascaded FWM sidebands resulting from the injection of two tones separated by 10 GHz. As can be seen, the cascaded tones have a frequency spacing of 10 GHz as well as a well-behaved temporal signal. The generation of harmonics and their evident phase locking is apparent in the closed loop limit cycle shown in the plot illustrated in FIG. 6b. The profile illustrated in FIG. 6b is representative of that which would be followed by an example design. The details of this profile are design dependent. FIG. 6c traces the trajectory to stability for two different initiation points (shown with stars), representing different intra-cavity phases for the second optical cavity. It is noted that the system stabilizes to the same phase-amplitude limit cycle regardless of the initial phase relation. This means the system has a stable operating point. A properly designed system can start operation at a number of points in the phase-amplitude space depicted in the plot, but will eventually converged on a stable and well-defined operating point for any design.

In one example embodiment, a power level of 10 nanoWatts (nW) per mode (10 nW/mode) of coupled power in the mode can be sufficient to effectively injection seed the second optical cavity. Accordingly, approximately 10 nW of primary tone power can be generated by nonlinear mixing of the secondary tones in the second optical cavity. This is an estimate of a lower limit for intra-cavity power and is based on the assumed spontaneous emission rates, losses, and other cavity parameters.

FIG. 7 shows preliminary calculations showing that stable limit cycles were obtained for frequencies ranging from 8 to 11 GHz when the compound resonator was tuned over 3 GHz. By adjusting internal controls, the differential output frequency can be controlled over a wide range of frequencies. In one embodiment, the compound resonator can be tuned over 40 GHz to provide an RF output signal from 1 to 40 GHz.

Figure 8A:
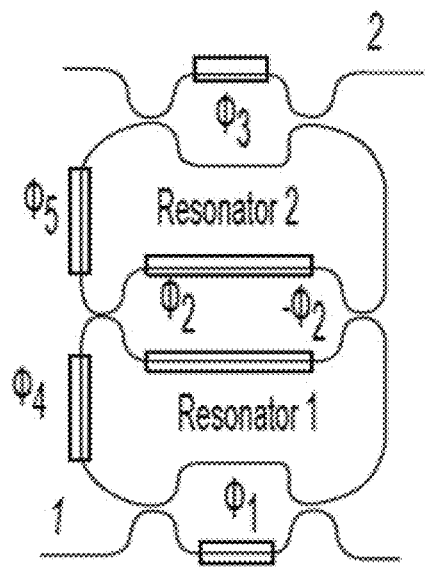
FIG. 8a illustrates the block diagram of a coupled resonator structure with a tunable doublet resonance controlled by a doublet phase shifter pair $\phi_2$ and $-\phi_2$ in accordance with an example.
Figure 8B:
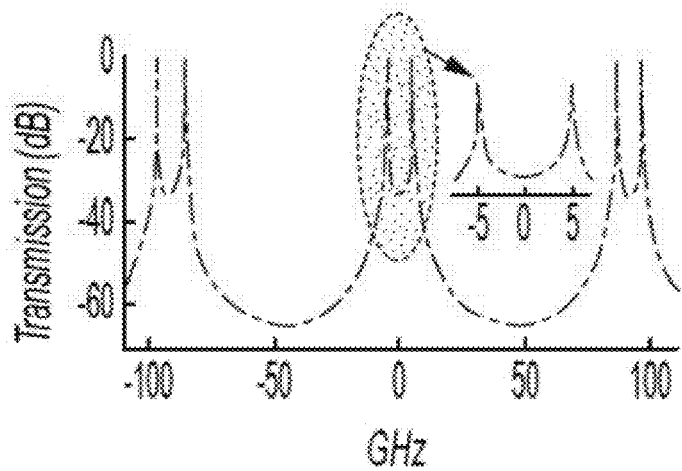
FIG. 8b illustrates a two tone signal which can be produced by a structure complying to the architecture depicted in FIG. 8a with a doublet spacing of 10 GHz in accordance with an example.
Figure 8C:
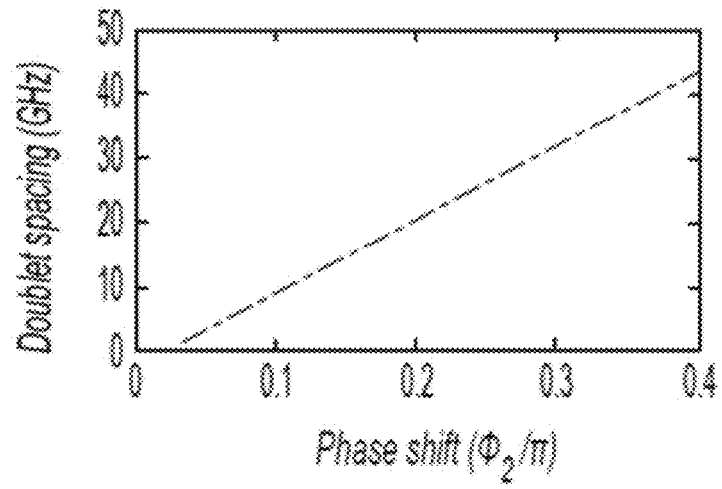

FIG. 8a illustrates a block diagram of a coupled resonator structure with a tunable doublet resonance controlled by a doublet phase shifter pair $\phi_2$ and $-\phi_2$. The coupled-resonator region of the device with different phase shifters is considered for device tuning. All of the splitters in this example architecture are a 50:50 design. FIG. 8b illustrates a two tone signal which can be produced by a structure complying to the architecture depicted in FIG. 8a with a doublet spacing of 10 GHz. A coupled resonator transmission spectrum is shown for a 10 GHz doublet enabled by $\varphi 2=0.1\pi$. FIG. 8c illustrates the frequency difference expected for a range of values of the doublet phase shifter of FIG. 8a. The variation of the frequency doublet spacing for different values of ($\varphi_2$) are illustrated. The values provide the level of phase shift for tuning the splitting within 1-40 GHz. In one example, the phase shifters are configured to consume minimal power and induce minimal resonator optical loss.

FIGS. 9a and 9b provide an example illustration of various phase shifters that can be used in the PIC 202 (FIG. 2a) to provide various functions. For example, $\varphi 1$, as shown in FIG. 9a and described in FIG. 9b, can be used to tune the coupling between the first resonator 954 and the waveguide 960. Similarly, $\varphi 3$ can be used to tune the coupling between the second resonator 956 and the waveguide 962. $\varphi 2$ and $-\varphi 2$ can be used to tune the doublet spacing to provide the level of phase shifting to adjust the frequency of the output RF oscillator signal from the photodetector 914. In one example, $\varphi 2$ and $-\varphi 2$ can tune the PIC 202 to provide an output between 1 GHz and 40 GHz, as previously described. However, this is not intended to be limiting. The doublet spacing and FSR for the first optical cavity and second optical cavity can be configured to provide a wide range of output, from 100 MHz to over 200 GHz.

Resonance misalignment in the first resonator 954 and second resonator 956 can be adjusted using $\varphi 4$ and $\varphi 5$. The resonance misalignment may be caused by fabrication errors in the fabrication of the PIC. The intracavity phase of the lower path 960 can be adjusted using $\varphi 6$. Similarly, the intracavity phase of the upper path 962 can be adjusted using $\varphi 7$. The reflectivity of the tunable mirror 924 can be adjusted using $\varphi 8$. The reflectivity of the tunable mirror 910 can be adjusted using $\varphi 9$. An example of power consumption for each of the phase shifters is illustrated in FIG. 9b. In this example, a total heat power consumption of approximately 1.4 Watts is used to adjust the phase shifters.

Collectively, the set of phase shifters shown in FIG. 9a can be used for (1) trimming of imbalances or imperfections result from manufacturing, (2) optimization of device performance by adjusting internal parameter, and (3) controlling the output frequency and phase noise. The control elements reflecting this are listed in the table of FIG. 9b.

The example power consumption listed in the table of FIG. 9b are tied to the phase shifters illustrated in the example of FIG. 9a and are merely representative of one of many possible control power allocations. Each phase shifter may use greater or lesser amounts of power based on the design specifications and architecture of the overall system, such as the example system illustrated in FIGS. 2a and 2b.

In one example, the phase shifters can be implemented using heaters placed on the waveguide in the PIC 202 (FIG. 2a). For instance, a metal micro-heater, using a thermally conductive metal with a high heat capacity, such as platinum, titanium, beryllium, or another desired metal, can be used to drive a thermo-optic induced effective path length change.

FIG. 10a provides an example illustration of a microheater 1066 used to heat a waveguide 1068 to drive a thermo-optic induced effective path length change. In this example, the waveguide is formed using silicon nitride (SiN). An example diagram of the waveguide 1068 is shown in FIG. 10c. The waveguide 1068 has a height of about 550 nanometers (nm) and a width of about 1500 to 2000 nm, as shown in FIG. 10c and described in 10d. The waveguide 1068 is encased in a layer of silicon dioxide ($SiO_2$) such that the micro-heater 1066 is separated from the top layer of the waveguide 1068 by about 1500 to 2000 nm. The micro-heater 1066 is about 1000 to 4000 nm in length along the waveguide. The micro-heater 1066 used for doublet tuning of $\varphi 2$ and $-\varphi 2$ can be about 1000 to 2000 nm in length along the waveguide 1068. The resonator absorption Q due to metal absorption from the metal micro-heater 1066 is shown in FIG. 10b. The micro-heater can be used to cause a temperature change in the silicon dioxide layer 1070, which will cause a temperature change in the waveguide 1068. The example values listed in FIG. 10d are for one exemplary system instantiation and are not intended to be limiting. Different waveguide dimensions, quality factor, bend radius, FSR, waveguide splitter length, heater spacing, and phase shifter length can be used to accomplish specific system design parameters.

Figure 11A:
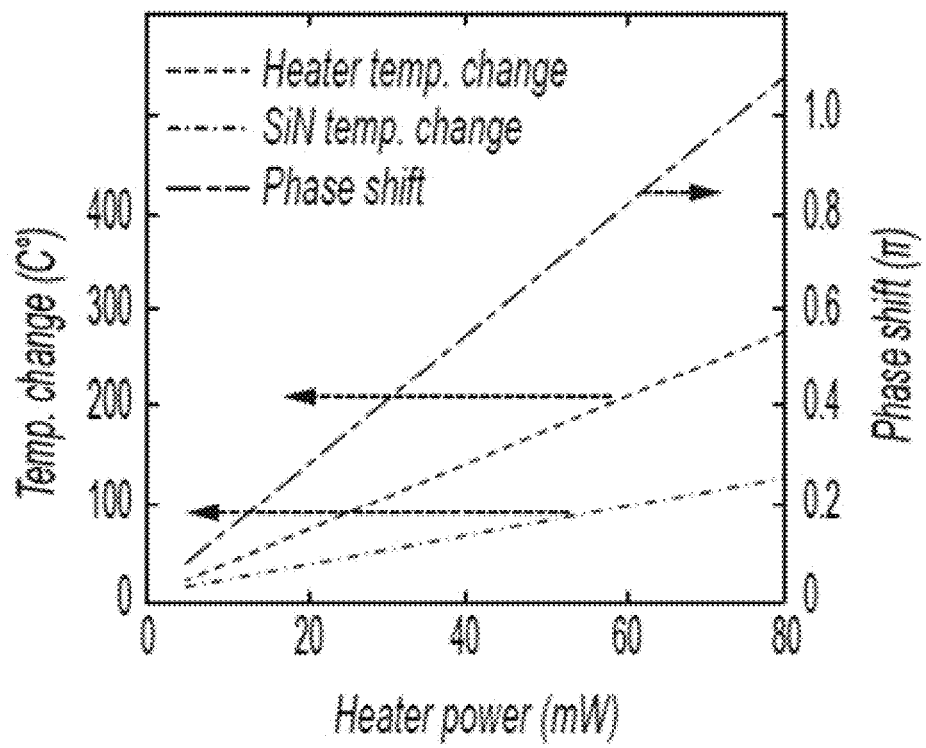
FIG. 11a illustrates a diagram showing micro-heater temperature change, silicon nitride waveguide temperature change, and phase shift in the silicon nitride waveguide due to the temperature change in accordance with an example.
Figure 11B:
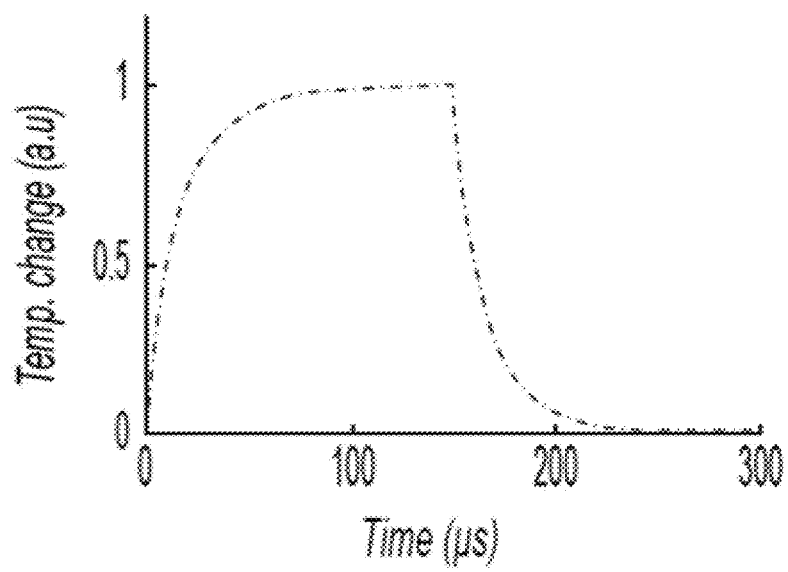
FIG. 11b illustrates a diagram showing a time for the temperature change of FIG. 11a to occur in accordance with an example.

As illustrated in the example of FIGS. 11a and 11b, a temperature change of 100 degrees Celsius in the waveguide 1068 can occur in about 50 microseconds, and result in a phase change of approximately $0.25\pi$ at a power level of 80 mW applied to the micro-heater. A temperature change of 200 degrees Celsius in the waveguide 1068 can result in a phase change of approximately $0.4\pi$. Accordingly, the micro-heaters can be used to provide a desired amount of phase change in the phase shifters $\varphi 1$ through $\varphi 9$ (FIG. 9a) within the power budgets listed in FIG. 9b. The power budgets are not intended to be limiting. They are provided as examples. The temperature shifts caused by the microheaters 1066 in the silicon dioxide layer 1070 and the SiN waveguide 1068 illustrated in FIG. 10a have been shown to occur without damage. Tens of watts of power may be used to drive thermo-optic induced effective path length changes at dozens of different locations to calibrate and tune the optic system within the PIC 202 to provide a desired optical or RF output from the PIC 202.

In accordance with one embodiment of the invention, a photonic dual resonance Radio Frequency (RF) oscillator is disclosed. The photonic dual resonance RF oscillator comprises an optical gain media coupled to a first mirror, the gain media configured to be coupled to a photonic integrated circuit (PIC). The PIC can comprise a first optical cavity located within the PIC, a first tunable mirror to form a first optical cavity between the first mirror in the gain media and the first tunable mirror, a frequency tunable intra-cavity dual tone resonator positioned within the first optical cavity to constrain the first optical cavity to produce two primary laser tones with a tunable frequency spacing, the two primary laser tones having a common optical path within the first optical cavity, and one or more phase adjusters to provide the tunable frequency spacing. The photonic dual resonance RF oscillator can further comprise a photo detector optically coupled to the PIC and configured to receive the two primary laser tones from the first tunable mirror and mix the two primary laser tones to form an RF output signal with a frequency selected by the tunable frequency spacing of the two primary laser tones.

In one embodiment, the PIC can further comprise a second optical cavity within the PIC that is optically coupled to the first optical cavity, an intracavity element providing non-linear optical gain, a second tunable mirror to form a second optical path between the first mirror in the gain media and the second tunable mirror, the second optical path passing through the intracavity element, and one or more phase adjusters to dynamically adjust phase delays within one or more of the first or the second cavities. The two primary laser tones can be injected into the second optical cavity from the first optical cavity and the second optical cavity can be configured to use the non-linear optical gain of the intracavity element to produce four wave mixing (FWM) to create at least two side tones from the two primary tones and reduce phase jitter and drift in the two primary tones to reduce a phase noise in the RF output signal.

In one embodiment, the intracavity element is located in one or more of the optical gain media, a waveguide optically coupled to the second tunable mirror, or a separate element optically coupled to the second tunable mirror.

The photonic dual resonance RF oscillator can further comprise an optical coupler configured to couple the two primary tones from the first optical cavity to the second optical cavity.

In one embodiment, the photodetector can be optically coupled to an output of the photonic dual resonance RF oscillator via a free-space coupling or a waveguide coupling. Alternatively, the photodetector can be resident on the PIC and optically coupled to the first tunable mirror.

In one embodiment, the photonic dual resonance RF oscillator can further comprise: a first waveguide implemented in the PIC that is optically coupled to the first mirror in the optical gain media and the second tunable mirror; a first resonant loop waveguide implemented in the PIC and spaced a selected distance from the first waveguide and configured to couple an optical laser signal from the first waveguide to the first resonant loop waveguide; a second resonant loop waveguide implemented in the PIC and spaced a selected distance from the first resonant loop waveguide and configured to couple the optical laser signal from the first resonant loop waveguide to the second resonant loop waveguide; and a second waveguide implemented in the PIC and spaced a selected distance from the second resonant loop waveguide and configured to couple the optical laser signal from the second resonant loop waveguide to the second waveguide, wherein the second waveguide is optically coupled to the first tunable mirror.

The one or more phase shifters, also referred to as phase adjusters, can comprise one or more of: a first phase adjuster coupled to the first waveguide and configured to tune an optical coupling between the first waveguide and the first resonant loop waveguide; or a third phase adjuster coupled to the second waveguide and configured to tune an optical coupling between the second waveguide and the second resonant loop waveguide; or a fourth phase adjuster coupled to the first resonant loop waveguide and configured to adjust resonance misalignment in the first resonant loop waveguide; or a fifth phase adjuster coupled to the second resonant loop waveguide and configured to adjust resonance misalignment in the second resonant loop waveguide; or a sixth phase adjuster coupled to the first waveguide and configured to adjust an intracavity phase of the second optical path; or a seventh phase adjuster coupled to the second waveguide and configured to adjust an intracavity phase of the first optical path; or an eighth phase adjuster coupled to the second adjustable mirror and configured to adjust a reflectivity of the second adjustable mirror; or a ninth phase adjuster coupled to the first adjustable mirror and configured to adjust a reflectivity of the first adjustable mirror.

The first, the third, the fourth, the fifth, the sixth, the seventh, the eighth, and the ninth phase shifters can be comprised of a metal micro-heater thermally coupled to one or more of the first waveguide, the first resonant loop waveguide, the second resonant loop waveguide or the second waveguide using a thermally conductive metal with a high heat capacity to drive a thermo-optic induced effective path length change in the respective waveguide. The example of a micro-heater used to provide a thermo-optic induced phase adjustment is not intended to be limiting. Other types of phase adjusters could also be used. For example, if the photonic material, such as a waveguide, is an electro-optic material, then phase adjusters or phase shifters can be implemented as electro-optic phase shifters.

In one embodiment, the one or more phase adjusters can be comprised of one or more of: a first doublet phase adjuster coupled to the second resonant loop waveguide; and a second doublet phase adjuster coupled to the first resonant loop waveguide. The first doublet phase adjuster and the second doublet phase adjuster can be configured to tune an optical frequency spacing between the two primary laser tones to select the frequency of the RF output.

In one embedment, the first doublet phase adjuster and the second doublet phase adjuster can be comprised of a metal micro-heater thermally coupled to one or more of the first resonator loop waveguide or the second resonator loop waveguide using a thermally conductive metal with a high heat capacity to drive a thermo-optic induced effective path length change in the respective waveguide. Alternatively, the first and second doublet phase adjusters can be implemented using an electro-optic phase shifter, or another desired type of phase shifter than can shift the phase of the optical signals within the first and second resonant loop waveguides by a desired amount within a selected time period based on system parameters. A typical time period can be between 25 microseconds and 200 microseconds.

In one embodiment, the frequency tunable intra-cavity dual tone resonator can further comprises a first optical resonator that is optically coupled to the second optical path, the first optical resonator including a first phase shifter and a second optical resonator that is optically coupled to the first resonator and the first optical path. The second optical resonator can include a second phase shifter. The first optical resonator and the second optical resonator can be configured as frequency tunable using the first and second phase shifters to provide doublet spacing to select the frequency of the RF output signal.

Various techniques, or certain aspects or portions thereof, can take the form of program code (i.e., instructions) embodied in tangible media, such as floppy diskettes, compact disc-read-only memory (CD-ROMs), flash drives, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random-access memory (RAM), erasable programmable read only memory (EPROM), flash drive, optical drive, magnetic hard drive, solid state drive, or other medium for storing electronic data. The low energy fixed location node, wireless device, and location server can also include a transceiver module (i.e., transceiver), a counter module (i.e., counter), a processing module (i.e., processor), and/or a clock module (i.e., clock) or timer module (i.e., timer). One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

As used herein, the term processor can include general purpose processors, specialized processors such as VLSI, FPGAs, or other types of specialized processors, as well as base band processors used in transceivers to send, receive, and process wireless communications.

It should be understood that many of the functional units described in this specification have been labeled as modules, in order to more particularly emphasize their implementation independence. For example, a module can be implemented as a hardware circuit comprising custom very-large-scale integration (VLSI) circuits or gate arrays, off-the-shelf semiconductors such as logic chips, transistors, or other discrete components. A module can also be implemented in programmable hardware devices such as field programmable gate arrays, programmable array logic, programmable logic devices or the like.

In one example, multiple hardware circuits or multiple processors can be used to implement the functional units described in this specification. For example, a first hardware circuit or a first processor can be used to perform processing operations and a second hardware circuit or a second processor (e.g., a transceiver or a baseband processor) can be used to communicate with other entities. The first hardware circuit and the second hardware circuit can be incorporated into a single hardware circuit, or alternatively, the first hardware circuit and the second hardware circuit can be separate hardware circuits.

Modules can also be implemented in software for execution by various types of processors. An identified module of executable code can, for instance, comprise one or more physical or logical blocks of computer instructions, which can, for instance, be organized as an object, procedure, or function. Nevertheless, the executables of an identified module need not be physically located together, but can comprise disparate instructions stored in different locations which, when joined logically together, comprise the module and achieve the stated purpose for the module.

Indeed, a module of executable code can be a single instruction, or many instructions, and can even be distributed over several different code segments, among different programs, and across several memory devices. Similarly, operational data can be identified and illustrated herein within modules, and can be embodied in any suitable form and organized within any suitable type of data structure. The operational data can be collected as a single data set, or can be distributed over different locations including over different storage devices, and can exist, at least partially, merely as electronic signals on a system or network. The modules can be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics can be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A photonic dual resonance Radio Frequency (RF) oscillator, comprising:
    an optical gain media coupled to a first mirror, the gain media configured to be coupled to a photonic integrated circuit (PIC);
    the PIC, comprising:
        a first optical cavity located within the PIC;
        a first tunable mirror to form a first optical cavity between the first mirror in the gain media and the first tunable mirror;
        a frequency tunable intra-cavity dual tone resonator positioned within the first optical cavity to constrain the first optical cavity to produce two primary laser tones with a tunable frequency spacing, the two primary laser tones having a common optical path within the first optical cavity; and
        one or more phase adjusters to provide the tunable frequency spacing;
    a photo detector optically coupled to the PIC and configured to receive the two primary laser tones from the first tunable mirror and mix the two primary laser tones to form an RF output signal with a frequency selected by the tunable frequency spacing of the two primary laser tones.

2. The photonic dual resonance RF oscillator of claim 1, wherein the PIC further comprises:
    a second optical cavity within the PIC that is optically coupled to the first optical cavity;
    an intracavity element providing non-linear optical gain;
    a second tunable mirror to form a second optical path between the first mirror in the gain media and the second tunable mirror, the second optical path passing through the intracavity element; and
    one or more phase adjusters to dynamically adjust phase delays within one or more of the first or the second cavities;
    wherein the two primary laser tones are injected into the second optical cavity from the first optical cavity and the second optical cavity is configured to use the non-linear optical gain of the intracavity element to produce four wave mixing (FWM) to create at least two side tones from the two primary tones and reduce phase jitter and drift in the two primary tones to reduce a phase noise in the RF output signal.

3. The photonic dual resonance RF oscillator of claim 2, wherein the phase noise in the RF output signal is less than −120 decibels relative to the carrier/Hertz (dBc/Hz) to −160 dBc/Hz.

4. The photonic dual resonance RF oscillator of claim 2, wherein the intracavity element is located in one or more of the optical gain media, a waveguide optically coupled to the second tunable mirror, or a separate element optically coupled to the second tunable mirror.

5. The photonic dual resonance RF oscillator of claim 2, further comprising an optical coupler configured to couple the two primary tones from the first optical cavity to the second optical cavity.

6. The photonic dual resonance RF oscillator of claim 2, further comprising:
    a first waveguide implemented in the PIC that is optically coupled to the first mirror in the optical gain media and the second tunable mirror;
    a first resonant loop waveguide implemented in the PIC and spaced a selected distance from the first waveguide and configured to couple an optical laser signal from the first waveguide to the first resonant loop waveguide;
    a second resonant loop waveguide implemented in the PIC and spaced a selected distance from the first resonant loop waveguide and configured to couple the optical laser signal from the first resonant loop waveguide to the second resonant loop waveguide; and
    a second waveguide implemented in the PIC and spaced a selected distance from the second resonant loop waveguide and configured to couple the optical laser signal from the second resonant loop waveguide to the second waveguide, wherein the second waveguide is optically coupled to the first tunable mirror.

7. The photonic dual resonance RF oscillator of claim 6, wherein the one or more phase adjusters comprises one or more of:
   a first phase adjuster coupled to the first waveguide and configured to tune an optical coupling between the first waveguide and the first resonant loop waveguide; or
   a third phase adjuster coupled to the second waveguide and configured to tune an optical coupling between the second waveguide and the second resonant loop waveguide; or
   a fourth phase adjuster coupled to the first resonant loop waveguide and configured to adjust resonance misalignment in the first resonant loop waveguide; or
   a fifth phase adjuster coupled to the second resonant loop waveguide and configured to adjust resonance misalignment in the second resonant loop waveguide; or
   a sixth phase adjuster coupled to the first waveguide and configured to adjust an intracavity phase of the second optical path; or
   a seventh phase adjuster coupled to the second waveguide and configured to adjust an intracavity phase of the first optical path; or
   an eighth phase adjuster coupled to the second adjustable mirror and configured to adjust a reflectivity of the second adjustable mirror; or
   a ninth phase adjuster coupled to the first adjustable mirror and configured to adjust a reflectivity of the first adjustable mirror.

8. The photonic dual resonance RF oscillator of claim 7, wherein:
   one or more of the first, the third, the fourth, the fifth, the sixth, the seventh, the eighth, or the ninth phase adjusters are comprised of a metal micro-heater thermally coupled to one or more of the first waveguide, the first resonant loop waveguide, the second resonant loop waveguide or the second waveguide using a thermally conductive metal with a high heat capacity to drive a thermo-optic induced effective path length change in the respective waveguide; or
   one or more of the first, the third, the fourth, the fifth, the sixth, the seventh, the eighth, or the ninth phase adjusters are comprised of an electro-optic phase shifter used to adjust a phase in one or more of the first waveguide, the first resonant loop waveguide, the second resonant loop waveguide or the second waveguide.

9. The photonic dual resonance RF oscillator of claim 6, wherein the one or more phase adjusters comprises one or more of:
   a first doublet phase adjuster coupled to the second resonant loop waveguide; and
   a second doublet phase adjuster coupled to the first resonant loop waveguide;
   wherein the first doublet phase adjuster and the second doublet phase adjuster are configured to tune an optical frequency spacing between the two primary laser tones to select the frequency of the RF output.

10. The photonic dual resonance RF oscillator of claim 9, wherein:
    the first doublet phase adjuster and the second doublet phase adjuster are comprised of a metal micro-heater thermally coupled to one or more of the first resonator loop waveguide or the second resonator loop waveguide using a thermally conductive metal with a high heat capacity to drive a thermo-optic induced effective path length change in the respective waveguide; or
    the first doublet phase adjuster and the second doublet phase adjuster are each comprised of an electro-optic phase shifter to change a phase within the first resonator loop waveguide or the second resonator loop waveguide, respectively.

11. The photonic dual resonance RF oscillator of claim 1, wherein:
    the photodetector is optically coupled to an output of the photonic dual resonance RF oscillator via a free-space coupling or a waveguide coupling; or
    the photodetector is resident on the PIC and optically coupled to the first tunable mirror.

12. The photonic dual resonance RF oscillator of claim 1, wherein the frequency tunable intra-cavity dual tone resonator further comprises:
    a first optical resonator that is optically coupled to the second optical path, the first optical resonator including a first phase shifter; and
    a second optical resonator that is optically coupled to the first resonator and the first optical path, the second optical resonator including a second phase shifter;
    wherein the first optical resonator and the second optical resonator are frequency tunable using the first and second phase shifters to provide doublet spacing to select the frequency of the RF output signal.

13. A photonic dual resonance Radio Frequency (RF) injection oscillator, comprising:
    an optical gain media coupled to a first mirror, the gain media configured to be coupled to a photonic integrated circuit (PIC);
    the PIC, comprising:
      a first optical cavity located within the PIC;
      a first tunable mirror to form a first optical cavity between the first mirror in the gain media and the first tunable mirror;
      a frequency tunable intra-cavity dual tone resonator positioned within the first optical cavity to constrain the first optical cavity to produce two primary laser tones with a tunable frequency spacing, the two primary laser tones having a common optical path within the first optical cavity;
      a second optical cavity within the PIC that is optically coupled to the first optical cavity and configured to receive the two primary laser tones; and
      an intracavity element providing non-linear optical gain;
      a second tunable mirror to form a second optical path between the first mirror in the gain media and the second tunable mirror, the second optical path passing through the intracavity element; and
      one or more phase adjusters to provide the tunable frequency spacing; and
    a photo detector optically coupled to the PIC and configured to receive the two primary laser tones from the first tunable mirror and mix the two primary laser tones to form an RF output signal with a frequency selected by the tunable frequency spacing of the two primary laser tones;
    wherein the two primary laser tones are injected into the second optical cavity from the first optical cavity and the second optical cavity is configured to use the non-linear optical gain of the intracavity element to produce four wave mixing (FWM) to create at least two side tones from the two primary tones and reduce phase jitter and drift in the two primary tones to reduce a phase noise in the RF output signal.

14. The photonic dual resonance RF oscillator of claim 13, wherein the PIC further comprises:

one or more phase adjusters to dynamically adjust phase delays within one or more of the first or the second cavities.

15. The photonic dual resonance RF oscillator of claim 13, wherein the phase noise in the RF output signal is less than −120 decibels relative to the carrier/Hertz (dBc/Hz) to −160 dBc/Hz.

16. The photonic dual resonance RF oscillator of claim 13, wherein the intracavity element is located in one or more of the optical gain media, a waveguide optically coupled to the second tunable mirror, or a separate element optically coupled to the second tunable mirror.

17. The photonic dual resonance RF oscillator of claim 13, further comprising an optical coupler configured to couple the two primary tones from the first optical cavity to the second optical cavity.

18. The photonic dual resonance RF oscillator of claim 13, wherein:
the photodetector is optically coupled to an output of the photonic dual resonance RF oscillator via a free-space coupling or a waveguide coupling; or
the photodetector is resident on the PIC and optically coupled to the first tunable mirror.

19. The photonic dual resonance RF oscillator of claim 13, further comprising:
a first waveguide implemented in the PIC that is optically coupled to the first mirror in the optical gain media and the second tunable mirror;
a first resonant loop waveguide implemented in the PIC and spaced a selected distance from the first waveguide and configured to couple an optical laser signal from the first waveguide to the first resonant loop waveguide;
a second resonant loop waveguide implemented in the PIC and spaced a selected distance from the first resonant loop waveguide and configured to couple the optical laser signal from the first resonant loop waveguide to the second resonant loop waveguide; and
a second waveguide implemented in the PIC and spaced a selected distance from the second resonant loop waveguide and configured to couple the optical laser signal from the second resonant loop waveguide to the second waveguide, wherein the second waveguide is optically coupled to the first tunable mirror.

20. The photonic dual resonance RF oscillator of claim 19, wherein the one or more phase adjusters comprises one or more of:
a first phase adjuster coupled to the first waveguide and configured to tune an optical coupling between the first waveguide and the first resonant loop waveguide; or
a third phase adjuster coupled to the second waveguide and configured to tune an optical coupling between the second waveguide and the second resonant loop waveguide; or
a fourth phase adjuster coupled to the first resonant loop waveguide and configured to adjust resonance misalignment in the first resonant loop waveguide; or
a fifth phase adjuster coupled to the second resonant loop waveguide and configured to adjust resonance misalignment in the second resonant loop waveguide; or
a sixth phase adjuster coupled to the first waveguide and configured to adjust an intracavity phase of the second optical path; or
a seventh phase adjuster coupled to the second waveguide and configured to adjust an intracavity phase of the first optical path; or an eighth phase adjuster coupled to the second adjustable mirror and configured to adjust a reflectivity of the second adjustable mirror; or
a ninth phase adjuster coupled to the first adjustable mirror and configured to adjust a reflectivity of the first adjustable mirror.

21. The photonic dual resonance RF oscillator of claim 20, wherein:
one or more of the first, the third, the fourth, the fifth, the sixth, the seventh, the eighth, and the ninth phase adjusters are comprised of a metal micro-heater thermally coupled to one or more of the first waveguide, the first resonant loop waveguide, the second resonant loop waveguide or the second waveguide using a thermally conductive metal with a high heat capacity to drive a thermo-optic induced effective path length change in the respective waveguide; or
one or more of the first, the third, the fourth, the fifth, the sixth, the seventh, the eighth, or the ninth phase adjusters are comprised of an electro-optic phase shifter used to adjust a phase in one or more of the first waveguide, the first resonant loop waveguide, the second resonant loop waveguide or the second waveguide.

22. The photonic dual resonance RF oscillator of claim 19, wherein the one or more phase adjusters comprises one or more of:
a first doublet phase adjuster coupled to the second resonant loop waveguide; and
a second doublet phase adjuster coupled to the first resonant loop waveguide;
wherein the first doublet phase adjuster and the second doublet phase adjuster are configured to tune an optical frequency spacing between the two primary laser tones to select the frequency of the RF output.

23. The photonic dual resonance RF oscillator of claim 22, wherein:
the first doublet phase adjuster and the second doublet phase adjuster are each comprised of a metal microheater thermally coupled to one or more of the first resonator loop waveguide or the second resonator loop waveguide using a thermally conductive metal with a high heat capacity to drive a thermo-optic induced effective path length change in the respective waveguide; or
the first doublet phase adjuster and the second doublet phase adjuster are each comprised of an electro-optic phase shifter to change a phase within the first resonator loop waveguide or the second resonator loop waveguide, respectively.

24. The photonic dual resonance RF oscillator of claim 13, wherein the frequency tunable intra-cavity dual tone resonator further comprises:
a first optical resonator that is optically coupled to the second optical path, the first optical resonator including a first phase shifter; and
a second optical resonator that is optically coupled to the first resonator and the first optical path, the second optical resonator including a second phase shifter;
wherein the first optical resonator and the second optical resonator are frequency tunable using the first and second phase shifters to provide doublet spacing to select the frequency of the RF output signal.

* * * * *